US010693015B2

(12) United States Patent
Jang

(10) Patent No.: US 10,693,015 B2
(45) Date of Patent: Jun. 23, 2020

(54) THIN FILM TRANSISTOR, METHOD FOR MANUFACTURING THE SAME AND DISPLAY DEVICE COMPRISING THE SAME

(71) Applicant: LG Display Co., Ltd., Seoul (KR)

(72) Inventor: Jaeman Jang, Paju-si (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 16/210,862

(22) Filed: Dec. 5, 2018

(65) Prior Publication Data
US 2019/0189805 A1 Jun. 20, 2019

(30) Foreign Application Priority Data

Dec. 15, 2017 (KR) ........................ 10-2017-0173298

(51) Int. Cl.
*H01L 29/786* (2006.01)
*H01L 27/12* (2006.01)
*H01L 29/66* (2006.01)
*G02F 1/1368* (2006.01)
*H01L 27/32* (2006.01)

(52) U.S. Cl.
CPC ........ *H01L 29/7869* (2013.01); *G02F 1/1368* (2013.01); *H01L 27/1225* (2013.01); *H01L 27/1288* (2013.01); *H01L 29/66659* (2013.01); *H01L 29/66969* (2013.01); *H01L 29/78618* (2013.01); *H01L 29/78624* (2013.01); *H01L 29/78633* (2013.01); *H01L 29/78696* (2013.01); *G02F 2001/13685* (2013.01); *H01L 27/3262* (2013.01)

(58) Field of Classification Search
CPC .................... H01L 29/78696; H01L 29/78624
See application file for complete search history.

(56) References Cited

U.S. PATENT DOCUMENTS

| 5,770,508 | A  | 6/1998  | Yeh et al.     |
|-----------|----|---------|----------------|
| 7,598,128 | B2 | 10/2009 | Hsu et al.     |
| 7,687,348 | B2 | 3/2010  | Tani           |
| 8,608,376 | B2 | 12/2013 | Kashyap et al. |

(Continued)

FOREIGN PATENT DOCUMENTS

| JP | H08-172199 A  | 9/1996  |
|----|---------------|---------|
| JP | 2005-310881 A | 11/2005 |

(Continued)

OTHER PUBLICATIONS

Yoshimi, M. et al., "Analysis of the Drain Breakdown Mechanism in Ultra-Thin-Film SOI MOSFET's," IEEE Transactions on Electron Devices, vol. 37, No. 9, Sep. 1990, pp. 2015-2021.

*Primary Examiner* — Thomas L Dickey
(74) *Attorney, Agent, or Firm* — Fenwick & West LLP

(57) ABSTRACT

A thin film transistor includes an oxide semiconductor layer on a substrate. The oxide semiconductor layer includes a channel portion, a first channel connecting portion connected to a first end of the channel portion, and a second channel connecting portion connected to a second end of the channel portion. A thickness of the second channel connecting portion is different from a thickness of the first channel connecting portion. The first end of the channel portion has a same thickness as the thickness of the first channel connecting portion, and the second end of the channel portion has a same thickness as the thickness of the second channel connecting portion.

20 Claims, 11 Drawing Sheets

(56) References Cited

U.S. PATENT DOCUMENTS

| | | | |
|---|---|---|---|
| 2001/0000074 A1 | 3/2001 | Park | |
| 2008/0290408 A1 | 11/2008 | Hsu et al. | |
| 2013/0043469 A1 | 2/2013 | Kawamura et al. | |
| 2013/0069054 A1 | 3/2013 | Isobe et al. | |
| 2014/0103332 A1 | 4/2014 | Ahn et al. | |
| 2014/0183522 A1 | 7/2014 | Cha et al. | |
| 2018/0175072 A1* | 6/2018 | Kim | H01L 27/1222 |

FOREIGN PATENT DOCUMENTS

| | | |
|---|---|---|
| JP | 2006-294995 A | 10/2006 |
| JP | 2008-071957 A | 3/2008 |
| JP | 2008-294433 A | 12/2008 |
| JP | 2013-247142 A | 12/2013 |
| JP | 2014-131047 A | 7/2014 |
| KR | 10-2014-0103836 A | 8/2014 |
| TW | 256940 B | 9/1995 |
| TW | 507381 B | 10/2002 |

\* cited by examiner

THIN FILM TRANSISTOR, METHOD FOR MANUFACTURING THE SAME AND DISPLAY DEVICE COMPRISING THE SAME

CROSS-REFERENCE TO RELATED APPLICATION

This application claims the priority benefit of Republic of Korea Patent Application No. 10-2017-0173298 filed on Dec. 15, 2017, the entire contents of which is incorporated herein by reference in its entirety.

BACKGROUND

Technical Field

The present disclosure relates to a thin film transistor, a method for manufacturing the same and a display device comprising the same.

Description of the Related Art

A transistor has been widely used in the field of electronic devices as a switching device or a driving device. Particularly, since a thin film transistor can be manufactured on a glass substrate or a plastic substrate, it has been widely used as a switching device of a display device such as a liquid crystal display device or an organic light emitting device.

Based on a material constituting an active layer, a thin film transistor may be categorized into an amorphous silicon thin film transistor in which an amorphous silicon is used as an active layer, a polycrystalline silicon thin film transistor in which a polycrystalline silicon is used as an active layer, and an oxide semiconductor thin film transistor in which an oxide semiconductor is used as an active layer.

For the oxide semiconductor thin film transistor (oxide semiconductor TFT), an oxide constituting the active layer may be deposited at a relatively low temperature, the mobility of the oxide semiconductor thin film transistor is high, and a change in the resistance of the oxide is great depending on the content of oxygen contained in an oxide semiconductor layer, whereby desired physical properties of the oxide semiconductor thin film transistor can easily be obtained. In addition, since the oxide semiconductor layer is transparent due to the properties of the oxide, the oxide semiconductor thin film transistor is advantageous in the realization of a transparent display.

Therefore, the oxide semiconductor thin film transistor can be used as a switching device or driving device of the display device. However, when the thin film transistor is driven, electric field accumulation occurs near a drain electrode connecting portion of the oxide semiconductor layer. Abnormal behaviors such as asymmetric degradation and mobility increase of the oxide semiconductor layer occur due to such electric field accumulation, whereby reliability of the thin film transistor is deteriorated.

SUMMARY

The present disclosure has been made in view of the above problems, and it is an object of the present disclosure to provide a thin film transistor that may prevent partial degradation of an oxide semiconductor layer from occurring by attenuating an accumulation of an electric field occurring in the oxide semiconductor layer when a thin film transistor is driven.

It is another object of the present disclosure to provide a thin film transistor including an oxide semiconductor layer having a thickness step difference, preventing degradation of the oxide semiconductor layer, which is caused by an accumulation of an electric field accumulation, from occurring.

It is still another object of the present disclosure to provide a method for manufacturing a thin film transistor described as above.

It is further still another object of the present disclosure to provide a display device comprising the thin film transistor described as above.

In accordance with an aspect of one embodiment of the present disclosure, the above and other objects can be accomplished by a thin film transistor comprising an oxide semiconductor layer on a substrate, the oxide semiconductor layer including a channel portion, a first channel connecting portion connected to a first end of the channel portion, and a second channel connecting portion connected to a second end of the channel portion that is opposite the first end of the channel portion. A gate insulating film is on the channel portion of the oxide semiconductor layer, and a gate electrode is on the gate insulating film. A source electrode is connected with the first channel connecting portion. A drain electrode is spaced apart from the source electrode, the drain electrode connected with the second channel connecting portion, wherein a thickness of the second channel connecting portion is different from a thickness of the first channel connecting portion, and the second end of the channel portion has a same thickness as the thickness of the second channel connecting portion.

In some embodiments, the thickness of the second channel connecting portion is 1.3 times to 1.7 times a thickness of the first end of the channel portion.

In some embodiments, at least a part of the second end of the channel portion has the same thickness as the thickness of the second channel connecting portion.

In some embodiments, a length of the portion of the second end of the channel portion having the same thickness as the thickness of the second channel connecting portion is 5% to 20% of an entire length of the channel portion.

In some embodiments, the first end of the channel portion has a same thickness as the thickness of the first channel connecting portion.

In some embodiments, the thickness of the first channel connecting portion is smaller than the thickness of the second channel connecting portion.

In some embodiments, a part of the channel portion between the first end of the channel portion and the second end of the channel portion has a thickness that is larger than the thickness of the first channel connecting portion and smaller than the thickness of the second channel connecting portion.

In some embodiments, the thickness of the first channel connecting portion is 0.3 times to 0.9 times the thickness of the part of the channel portion between the first end of the channel portion and the second end of the channel portion.

In some embodiments, a length of the first end of the channel portion having the same thickness as the first channel connecting portion is 5% to 15% of an entire length of the channel portion.

In accordance with an aspect of one embodiment of the present disclosure, the above and other objects can be accomplished by a method for manufacturing a thin film transistor, the method comprising forming an oxide semiconductor layer on a substrate, the oxide semiconductor layer formed to include a channel portion, a first channel connecting portion connected to a first end of the channel portion, and a second channel connecting portion connected to a second end of the channel portion that is opposite the first end of the channel portion. A gate insulating film on the channel portion of the oxide semiconductor layer is formed. A gate electrode is formed on the gate insulating film. A source electrode is formed, the source electrode connected with the first channel connecting portion. A drain electrode spaced apart from the source electrode is formed, the drain electrode connected with the second channel connecting portion, wherein a thickness of the second channel connecting portion is formed to be different from a thickness of the first channel connecting portion, and the second end of the channel portion is formed to have a same thickness as the thickness of the second channel connecting portion.

In accordance with an aspect of one embodiment of the present disclosure, the above and other objects can be accomplished by a display device comprising a substrate, a display panel including a plurality of pixels, each pixel including a thin film transistor disposed on the substrate. At least one thin film transistor comprises an oxide semiconductor layer on the substrate, the oxide semiconductor layer including a channel portion, a first channel connecting portion connected to a first end of the channel portion, and a second channel connecting portion connected to a second end of the channel portion that is opposite the first end of the channel portion. A gate insulating film is on the channel portion of the oxide semiconductor layer. A gate electrode is on the gate insulating film. A source electrode is connected with the first channel connecting portion. A drain electrode is spaced apart from the source electrode and connected with the second channel connecting portion, wherein a thickness of the second channel connecting portion is different from a thickness of the first channel connecting portion, and the second end of the channel portion has a same thickness as the thickness of the second channel connecting portion.

BRIEF DESCRIPTION

The above and other objects, features and other advantages of the present disclosure will be more clearly understood from the following detailed description taken in conjunction with the accompanying drawings, in which.

DETAILED DESCRIPTION

Figure 1:
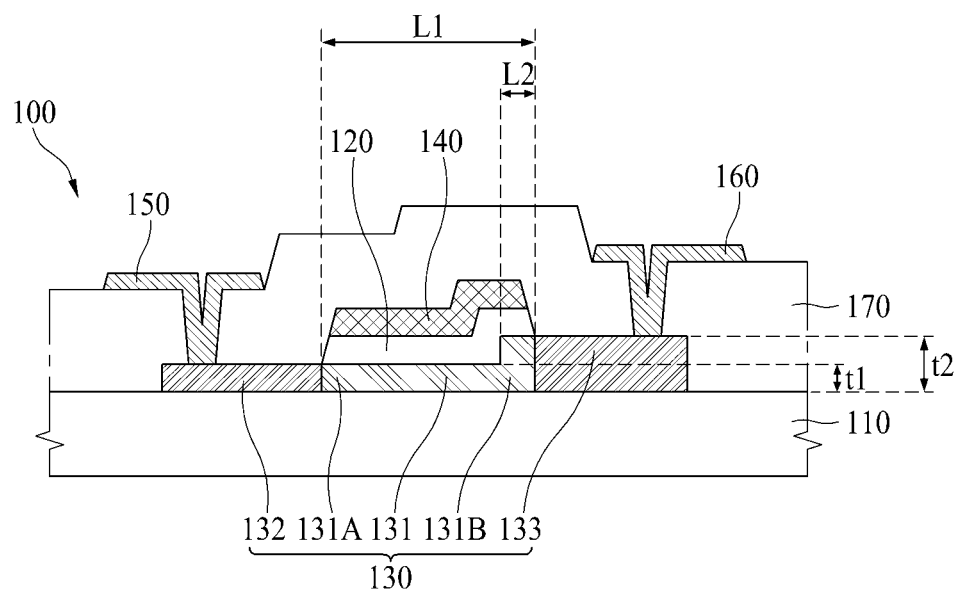
FIG. 1 is a cross-sectional view illustrating a thin film transistor according to one embodiment of the present disclosure.

Advantages and features of the present disclosure, and implementation methods thereof will be clarified through the following embodiments, described with reference to the accompanying drawings. The present disclosure may, however, be embodied in different forms and should not be construed as being limited to the embodiments set forth herein. Rather, these embodiments are provided so that this disclosure will be thorough and complete, and will fully convey the scope of the present disclosure to those skilled in the art. Further, the present disclosure is only defined by the scope of the claims.

The shapes, sizes, ratios, angles, and numbers disclosed in the drawings for describing embodiments of the present disclosure are merely examples, and thus the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In the case in which "comprise," "have," and "include" described in the present specification are used, another part may also be present unless "only" is used. The terms in a singular form may include plural forms unless noted to the contrary.

In construing an element, the element is construed as including an error region although there is no explicit description thereof.

In describing a positional relationship, for example, when the positional order is described as "on," "above," "below," and "next," the case of no contact therebetween may be included, unless "just" or "direct" is used. If it is mentioned that a first element is positioned "on" a second element, it does not mean that the first element is essentially positioned above the second element in the figure.

Spatially relative terms "below", "beneath", "lower", "above", and "upper" may be used to easily describe a relationship between one device or elements and another device or elements as shown. The spatially relative terms should be understood as terms including different directions of a device during use or operation in addition to a direction shown in the drawings. For example, if the device shown in the drawing is reversed, a device disposed "below" or "beneath" may be arranged "above" another device. Therefore, the term "below" may include directions related to "below" and "above".

In describing a temporal relationship, for example, when the temporal order is described as "after," "subsequent," "next," and "before," a case which is not continuous may be included, unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in a co-dependent relationship. In the present disclosure, the term "conductorize" means "make a part of a layer (i.e. semiconductor layer) conductive, and the term "conductorization" means "making a part of a layer (i.e. semiconductor layer) conductive.

Hereinafter, the preferred embodiments of a thin film transistor, a method for manufacturing the same and a display device comprising the same according to one embodiment of the present disclosure will be described in detail with reference to the accompanying drawings. Wherever possible, the same reference numbers will be used throughout the drawings to refer to the same or like parts.

FIG. 1 is a cross-sectional view illustrating a thin film transistor 100 according to one embodiment of the present disclosure.

Referring to FIG. 1, the thin film transistor 100 according to one embodiment of the present disclosure includes an oxide semiconductor layer 130 on a substrate 110, a gate insulating film 120 on the oxide semiconductor layer 130, a gate electrode 140 on the gate insulating film 120, a source electrode 150 connected with the oxide semiconductor layer 130, and a drain electrode 160 spaced apart from the source electrode 150 and connected with the oxide semiconductor layer 130. In this case, an inter-layer insulation film 170 is disposed on the gate electrode 140, and the source electrode 150 and the drain electrode 160 are disposed on the inter-layer insulation film 170.

Glass or plastic may be used as the substrate 110. A transparent plastic which has a flexible property, for example, polyimide may be used as the plastic.

Although not shown, a buffer layer may be disposed on the substrate 110. The buffer layer may include at least one of a silicon oxide and a silicon nitride. The buffer layer protects the oxide semiconductor layer 130, and may planarize an upper portion of the substrate 110.

The oxide semiconductor layer 130 is disposed on the substrate 110. The oxide semiconductor layer 130 includes an oxide semiconductor material. For example, the oxide semiconductor layer 130 may include at least one of IZO (InZnO)-, IGO(InGaO)-, ITO (InSnO)-, IGZO(InGaZnO)-, IGZTO (InGaZnSnO), GZTO (GaZnSnO)-, GZO (GaZnO)-, and ITZO (InSnZnO)-based oxide semiconductor materials. However, one embodiment of the present disclosure is not limited to this example, and the oxide semiconductor layer 130 may be made of other oxide semiconductor material known in the art.

The gate insulating film 120 is disposed on the oxide semiconductor layer 130. The gate insulating film 120 may include at least one of a silicone oxide and a silicon nitride, or may include a metal oxide or a metal nitride. The gate insulating film 120 may have a single layer structure or a multi-layer structure.

According to one embodiment of the present disclosure, the gate insulating film 120 is partially overlapped with the oxide semiconductor layer 130.

The gate electrode 140 is disposed on the gate insulating film 120. The gate electrode 140 is insulated from the oxide semiconductor layer 130 and overlapped with at least a part of the oxide semiconductor layer 130.

The gate electrode 140 may include at least one of aluminum based metal such as aluminum (Al) or an aluminum alloy, silver based metal such as silver (Ag) or a silver alloy, copper (Cu) based metal such as Cu or a Cu alloy, molybdenum (Mo) based metal such as Mo or an Mo alloy, chrome (Cr), tantalum (Ta), neodymium (Nd), and titanium (Ti). The gate electrode 140 may have a structure of a multi-layered film including at least two conductive films having their respective physical properties different from each other.

The inter-layer insulation film 170 is disposed on the gate electrode 140. The inter-layer insulation film 170 is made of an insulating material. In detail, the inter-layer insulation film 170 may be made of an organic material, an inorganic material, or a laminate of an organic layer and an inorganic layer.

The source electrode 150 and the drain electrode 160 are disposed on the inter-layer insulation film 170. Each of the source electrode 150 and the drain electrode 160 is connected with the oxide semiconductor layer 130 while they are spaced apart from each other. Each of the source electrode 150 and the drain electrode 160 is connected with the oxide semiconductor layer 130 though a contact hole formed in the inter-layer insulation film 170.

The source electrode 150 and the drain electrode 160 may include at least one of Mo, Al, Cr, Au, Ti, Ni, Nd, Cu and their alloy. Each of the source electrode 150 and the drain electrode 160 may be formed of a single layer made of a metal or a metal alloy, or may be formed of a multi-layer with two or more of layers.

Hereinafter, the oxide semiconductor layer 130 will be described in more detail.

Referring to FIG. 1, the oxide semiconductor layer 130 includes a channel portion 131 overlapped with the gate insulating film 120, a first channel connecting portion 132 disposed at one side of the channel portion 131 and a second channel connecting portion 133 disposed at the other side of the channel portion 131. That is, the first channel connecting portion 132 is connected to a first end 131A of the channel portion 131 and the second channel connecting portion 133 is connected to a second end 131B of the channel portion 131 that is opposite the first end 131A of the channel portion 131. In one embodiment, the first end 131A of the channel portion 131 is the left end of the channel portion 131 and the second end 131B of the channel portion 131 is the right end of the channel portion 131.

A channel of the oxide semiconductor layer 130 is formed in the channel portion 131. The channel portion 131 is overlapped with the gate electrode 140.

Referring to FIG. 1, the first channel connecting portion 132 and the second channel connecting portion 133 are portions of the oxide semiconductor layer 130 that are not overlapped with the gate insulating film 120. The first channel connecting portion 132 and the second channel connecting portion 133 may be formed by selective conductorization of the oxide semiconductor layer 130. For a conductorization, plasma treatment or hydrogen treatment may be performed for the first channel connecting portion 132 and the second channel connecting portion 133. However, one embodiment of the present disclosure is not limited to this case, and the first channel connecting portion 132 and the second channel connecting portion 133 may be conductorized by another method known in the art.

According to one embodiment of the present disclosure, the first channel connecting portion 132 is connected with the source electrode 150, and the second channel connecting portion 133 is connected with the drain electrode 160. The oxide semiconductor layer 130 may be electrically in contact with each of the source electrode 150 and the drain electrode 160 through the first channel connecting portion 132 and the second channel connecting portion 133.

According to one embodiment of the present disclosure, the first channel connecting portion 132 and the second channel connecting portion 133 are referred to as the channel connecting portions 132 and 133. Also, the first channel connecting portion 132 connected with the source electrode 150 is referred to as a "source connecting portion", and the second channel connecting portion 133 connected with the drain electrode 160 is referred to as a "drain connecting portion".

The oxide semiconductor layer 130 has a first thickness t1 and a second thickness t2. In this case, the second thickness t2 is greater than the first thickness t1 (t2>t1).

Referring to FIG. 1, the first end 131A of the channel portion 131 is in contact with the first channel connecting portion 132 and has a first thickness t1. The second end 131B of the channel portion 131 opposite the first end 131A is in contact with the second channel connecting portion 133 and has a second thickness t2. In detail, a first length of the channel portion 131 that extends from a boundary between the first end 131A and the first channel connecting portion 132 to the start of the second end 131B has the first thickness t1. A second length of the channel portion 131 has the second thickness t2. The second length extends from a boundary between the second end 131B and the second channel connecting portion 133 to the portion of the channel portion 131 with the first thickness t1. The first length of the channel portion 131 and the second length of the channel portion 131 are directly adjacent to each other, and the channel portion 131 has a step difference of a thickness at the boundary between the first length and the second length.

Referring to FIG. 1, the second channel connecting portion 133 has the second thickness t2.

In the thin film transistor 100 according to one embodiment of the present disclosure, a voltage applied to the second channel connecting portion 133 connected with the drain electrode 160 is higher than that applied to the first channel connecting portion 132 connected with the source electrode 150. When the thin film transistor 100 is operated as a gate voltage VG is applied to the gate electrode 140, an electric field is accumulated on the second channel connecting portion 133 to which a relatively high voltage is applied. In more detail, the electric field is accumulated on a boundary portion between the channel portion 131 having a relatively low carrier concentration and the second channel connecting portion 133 having a relatively high carrier concentration, to which a high voltage is applied. Physical or electric degradation may occur in the boundary portion between the channel portion 131 and the second channel connecting portion 133, on which the electric field is accumulated.

According to one embodiment of the present disclosure, the boundary between the channel portion 131 and the second channel connecting portion 133 has a thickness (for example, t2) greater than that of the other area of the channel portion 131, whereby electric field accumulation may be attenuated.

Hereinafter, attenuation of electric field accumulation will be described with reference to FIGS. 1, 2 and 3.

Generally, the channel of the oxide semiconductor layer 130 is formed in the channel portion 131 but an entire area of the channel portion 131 does not serve as a channel. Since some areas of the channel portion 131 adjacent to the channel connecting portions 132 and 133 are conductorized during a conductorization process of the channel connecting portions 132 and 133, a length of the channel is shorter than a length L1 of the channel portion 131.

Figure 2:
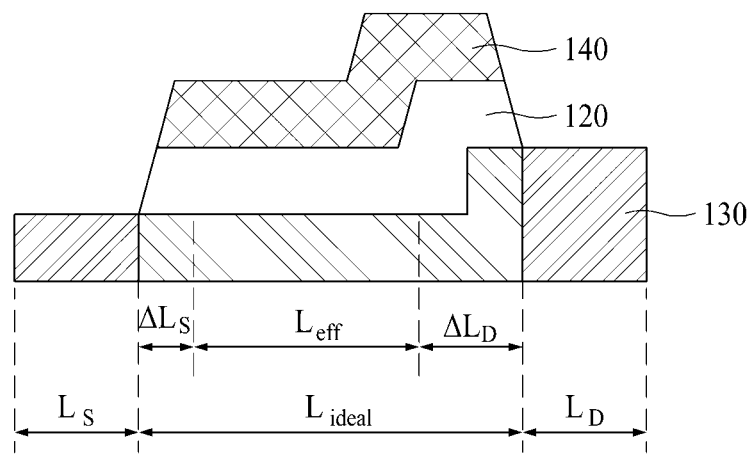
FIG. 2 is a schematic view illustrating conductorization permeation lengths of an oxide semiconductor layer according to one embodiment of the present disclosure.

FIG. 2 is a schematic view illustrating conductorization permeation lengths $\Delta L_S$ and $\Delta L_D$ of an oxide semiconductor layer according to one embodiment of the disclosure. Referring to FIG. 2, a length of the channel portion 131 of the oxide semiconductor layer 130 is denoted by "$L_{ideal}$", and a length of the first channel connecting portion 132 and a length of the second channel connecting portion 133 are denoted by "$L_S$" and "$L_D$", respectively.

Some areas of the channel portion 131 are conductorized during a conductorization process of the channel connecting portions 132 and 133, and the conductorized area does not serve as a channel. In FIG. 2, lengths of the conductorized areas of the channel portion 131 are referred to as conductorization permeation lengths "$\Delta L_S$" and "$\Delta L_D$", respectively. Also, a length of a portion of the channel portion 131, which may effectively serve as a channel, is referred to as an effective channel length $L_{eff}$. The greater the conductorization permeation lengths $\Delta L_S$ and $\Delta L_D$ are, the shorter the effective channel length $L_{eff}$ is.

Figure 3:
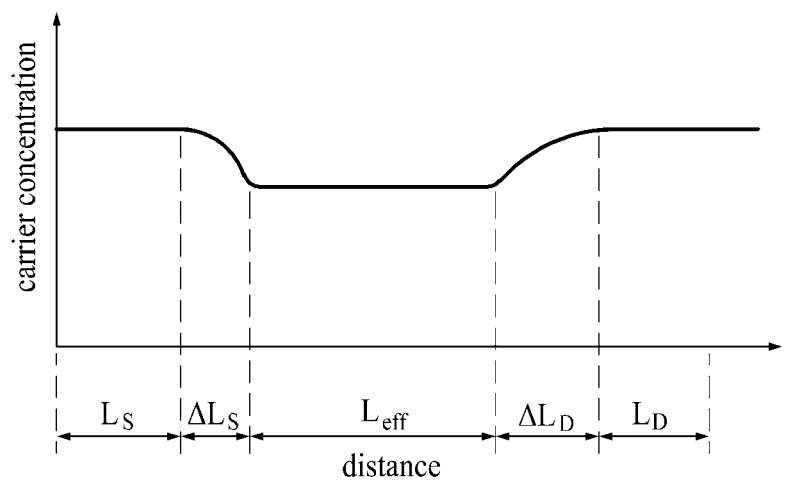
FIG. 3 is a graph illustrating a carrier concentration in an oxide semiconductor layer according to one embodiment of the present disclosure.

FIG. 3 is a graph illustrating a carrier concentration in an oxide semiconductor layer according to one embodiment of the disclosure. A horizontal axis of FIG. 3 corresponds to a length measured from a left end $L_S$ of the oxide semiconductor layer shown in FIG. 2.

Figure 11:
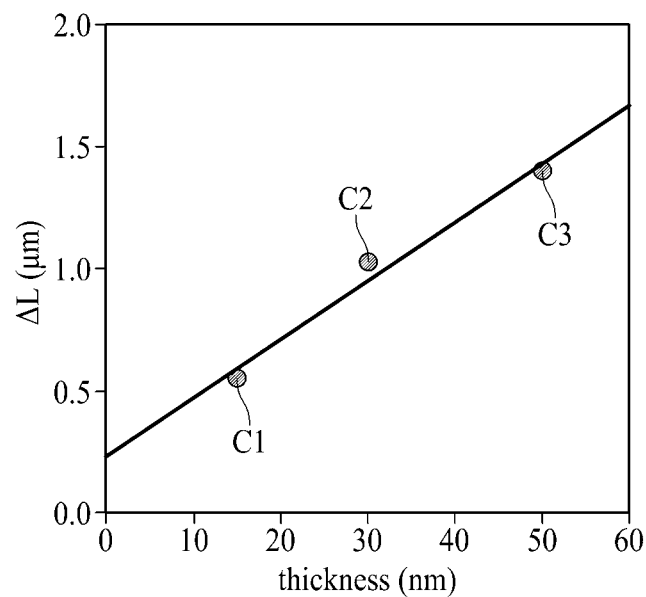
FIG. 11 is a graph illustrating $\Delta L$ according to a thickness of an oxide semiconductor layer according to one embodiment of the present disclosure.

Generally, plasma treatment or hydrogen treatment for conductorizing the channel connecting portions 132 and 133 is performed on a surface of the oxide semiconductor layer 130, and if the oxide semiconductor layer 130 becomes thicker, a diffusion range of a conductorizing component such as hydrogen is widened, whereby the conductorization permeation lengths $\Delta L_S$ and $\Delta L_D$ are increased (see experimental example 1 and FIG. 11). Therefore, according to one embodiment of the present disclosure, the conductorization permeation length $\Delta L_D$ at the second channel connecting portion 133 is longer than the conductorization permeation length $\Delta L_S$ at the first channel connecting portion 132.

Meanwhile, a carrier concentration gradient occurs between an effective channel area and the channel connecting portions 132 and 133 due to a difference in carrier concentration. In detail, a gradient of a carrier concentration occurs in the conductorized areas ($\Delta L_S$ area and $\Delta L_D$ area) of the channel portion 131. At this time, if the conductorization permeation lengths $\Delta L_S$ and $\Delta L_D$ are increased, as shown in FIG. 3, a change in a carrier concentration per unit length is reduced, and a slow concentration gradient occurs. As shown in FIG. 3, since the conductorization permeation length $\Delta L_D$ at the side of the second channel connecting portion 133 is long, electric field accumulation is attenuated as a change in a carrier concentration in the area corresponding to $\Delta L_D$ is reduced.

In this way, if a thickness near the portion between the second channel connecting portion 133 and the channel portion 131, in which electric field accumulation occurs, is increased, electric field accumulation may be attenuated.

However, if the whole thickness of the oxide semiconductor layer 130 is increased for attenuation of electric field accumulation, the conductorization permeation lengths $\Delta L_S$ and $\Delta L_D$ are all increased at the first channel connecting portion 132 and the second channel connecting portion 133, whereby a problem occurs in that the effective channel length $L_{eff}$ is reduced. Therefore, according to one embodiment of the present disclosure, the thickness of the second channel connecting portion 133 is selectively increased, whereby electric field accumulation is attenuated and reduction of the effective channel length $L_{eff}$ is minimized.

According to one embodiment of the present disclosure, the second thickness t2 is 1.3 times to 1.7 times of the first thickness t1 ($1.3 \leq t2/t1 \leq 1.7$). If the second thickness t2 is less than 1.3 times of the first thickness t1, the conductorization permeation length $\Delta L_D$ at the second channel connecting portion 133 is not increased sufficiently, whereby electric field accumulation is not attenuated sufficiently. On the contrary, if the second thickness t2 exceeds 1.7 times of the first thickness t1, the gate insulating film 120 may fail to sufficiently insulate the gate electrode 140 from the oxide semiconductor layer 130 due to a big difference in thickness in the oxide semiconductor layer 130. The effective channel length $L_{eff}$ is reduced due to excessive increase of the conductorization permeation length $\Delta L_D$ at the second channel connecting portion 133, whereby characteristic of a threshold voltage Vth of the thin film transistor may be deteriorated.

According to one embodiment of the present disclosure, the first thickness t1 of the oxide semiconductor layer 130 may be adjusted in the range of 10 nm to 40 nm, and its second thickness t2 may be adjusted in the range of 13 nm to 68 nm. The second thickness t2 of the oxide semiconductor layer 130 may be varied depending on a size and usage of the oxide semiconductor layer 130.

Also, if a length L2 of an area having the second thickness t2 in the channel portion 131 exceeds 20% of an entire length L1 of the channel portion 131, the conductorization permeation length $\Delta L_D$ at the second channel connecting portion 133 may be increased, whereby the effective channel length $L_{eff}$ may be reduced. On the other hand, if the length L2 of the area having the second thickness t2 in the channel portion 131 is less than 5% of the entire length L1 of the channel portion 131, the conductorization permeation length $\Delta L_D$ at the second channel connecting portion 133 is little increased, whereby an attenuation effect of electric field accumulation may not be sufficient. Therefore, the length L2 of the area having the second thickness t2 in the channel portion 131 may be adjusted in the range of 5% to 20% of the entire length L1 of the channel portion 131.

Figure 4:
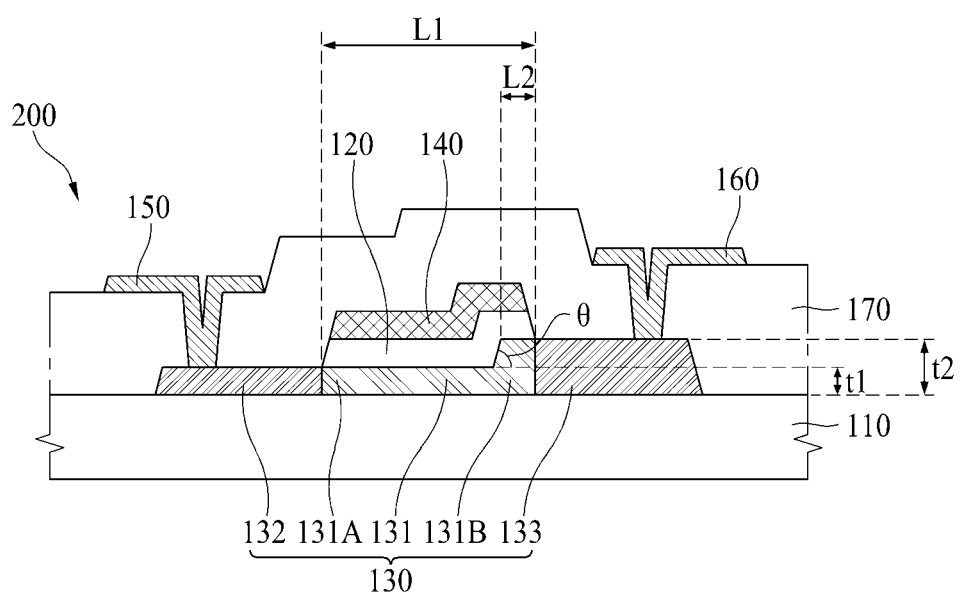
FIG. 4 is a cross-sectional view illustrating a thin film transistor according to another embodiment of the present disclosure.

FIG. 4 is a cross-sectional view illustrating a thin film transistor 200 according to another embodiment of the present disclosure. Hereinafter, description of the elements that have been already described above will be omitted to avoid repetition of description.

Referring to FIG. 4, an inclination is formed between an area having a second thickness t2 and an area having a first thickness t1 in the channel portion 131. An inclined angle θ may be, but not limited to, 45° or more.

The inclination between the area having the second thickness t2 and the area having the first thickness t1 may be formed during a process of manufacturing the channel portion 131. In the oxide semiconductor layer 130, the length L1 of the channel portion 131 is μm to several tens of μm, whereas the first thickness t1 and the second thickness t2 are very thin in the range of several tens of nm. Therefore, there is no big difference in an attenuation effect of electric field accumulation in accordance with the inclined angle θ.

Figure 5:
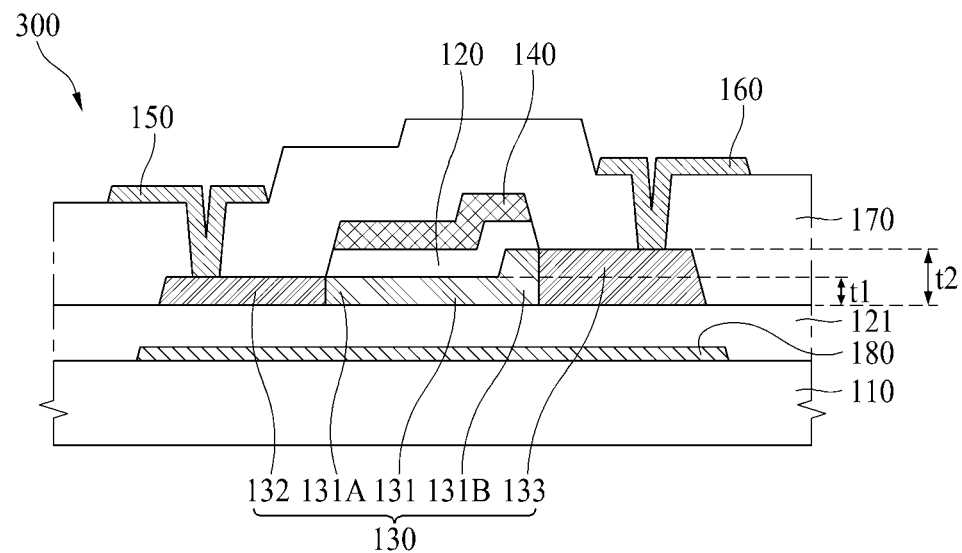
FIG. 5 is a cross-sectional view illustrating a thin film transistor according to still another embodiment of the present disclosure.

FIG. 5 is a cross-sectional view illustrating a thin film transistor 300 according to still another embodiment of the present disclosure.

The thin film transistor 300 of FIG. 5 further includes a light-shielding layer 180 on a substrate 110 and a buffer layer 121 on the light-shielding layer 180 as compared with the thin film transistor 200 in FIG. 4.

The light-shielding layer 180 is overlapped with the oxide semiconductor layer 130. The light-shielding layer 180 shields incident light, which externally enters the oxide semiconductor layer 130, to prevent the oxide semiconductor layer 130 from being damaged due to external incident light. The light-shielding layer 180 may be made of an electric conductive material such as a metal.

The buffer layer 121 is disposed on the light-shielding layer 180. The buffer layer 121 may include at least one of a silicon oxide and a silicon nitride. The buffer layer 121 may be formed of a single film, or may be formed of a deposited structure in which two or more films are deposited. The buffer layer 121 has excellent insulation property and planarization property, and may protect the oxide semiconductor layer 130.

Figure 6:
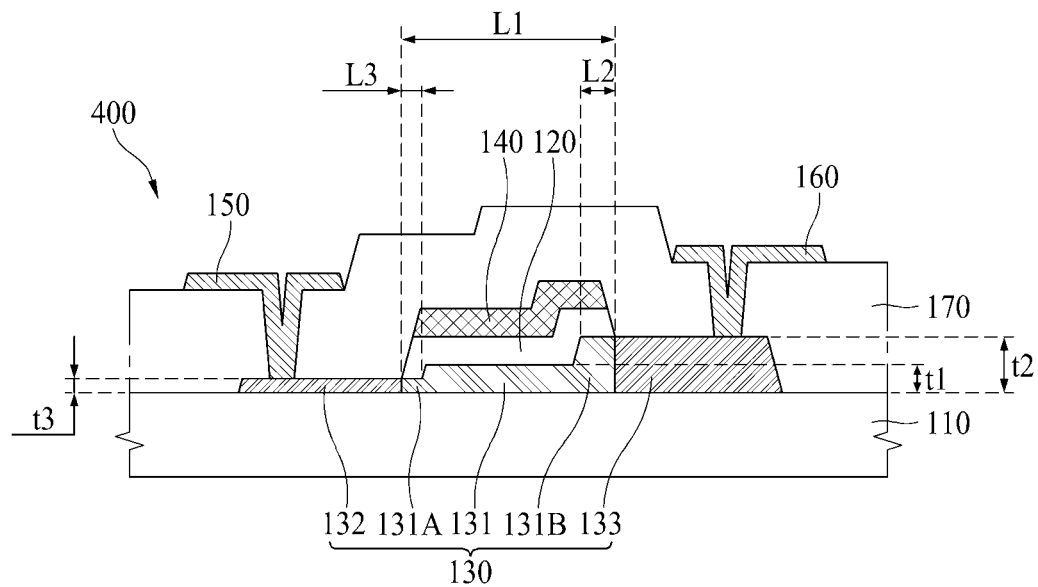
FIG. 6 is a cross-sectional view illustrating a thin film transistor according to further still another embodiment of the present disclosure.

FIG. 6 is a cross-sectional view illustrating a thin film transistor 400 according to further still another embodiment of the present disclosure.

In the thin film transistor 400 of FIG. 6, the oxide semiconductor layer 130 has a first thickness t1, a second thickness t2 and a third thickness t3 and two thickness step differences as compared with the thin film transistor 100 of FIG. 1.

In detail, the oxide semiconductor layer 130 shown in FIG. 6 has the third thickness t3 smaller than the first thickness t1. The first channel connecting portion 132 has the third thickness t3, and at least a part of the channel portion 131 has also the third thickness t3. The area having the third thickness t3 in the channel portion is connected with the first channel connecting portion 132.

If the first channel connecting portion 132 has the third thickness t3 as compared with the case that the first channel connecting portion 132 has the first thickness t1, the conductorization permeation length $\Delta L_S$ at the first channel connecting portion 132 is reduced, whereby the effective channel length $L_{eff}$ may be increased. Also, if the conductorization permeation length $\Delta L_S$ at the first channel connecting portion 132 is reduced, since a deviation of the conductorization permeation length $\Delta L_S$ at the first channel connecting portion 132 is also reduced in mass production of the thin film transistor 400 using a large sized mother glass, a deviation of a threshold voltage Vth of the thin film transistor 400 may be reduced. Therefore, uniformity of the threshold voltage Vth of the thin film transistor 400 may be improved.

If the third thickness t3 is less than 0.3 times of the first thickness t1, efficiency of charge supply through the first channel connecting portion 132 may be deteriorated. On the other hand, if the third thickness t3 exceeds 0.9 times of the first thickness t1, an effect of thickness reduction is little generated. Therefore, the third thickness t3 may be adjusted in the range of 0.3 times to 0.9 times of the first thickness t1 ($0.3 \leq t3/t1 \leq 0.9$).

If the length L3 of the area having the third thickness t3 in the channel portion 131 is less than 5% of the entire length L1 of the channel portion 131, the conductorization permeation length $\Delta L_S$ at the first channel connecting portion 132 is not reduced greatly, an effect of thickness reduction may little occur. On the other hand, if the length L3 of the area having the third thickness t3 in the channel portion 131 exceeds 15% of the entire length L1 of the channel portion 131, current characteristic of the thin film transistor 400 may be deteriorated due to thickness reduction of the channel portion 131. Therefore, the length L3 of the area having the third thickness t3 in the channel portion 131 may be adjusted in the range of 5% to 15% of the entire length L1 of the channel portion 131.

Hereinafter, a method for manufacturing a thin film transistor 300 will be described with reference to FIGS. 7A to 7H. FIGS. 7A to 7H are manufacturing process views illustrating processes of manufacturing a thin film transistor according to another embodiment of the present disclosure.

Figure 7A:
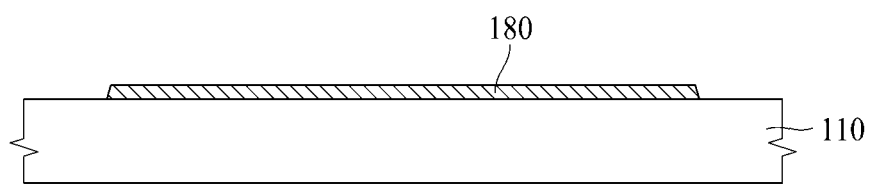
FIGS. 7A to 7H are manufacturing process views illustrating processes of manufacturing a thin film transistor according to another embodiment of the present disclosure.

Referring to FIG. 7A, the light-shielding layer 180 is formed on a substrate 110.

A glass may be used as the substrate 110, and a plastic that can be bent or curved may be used as well. An example of a plastic that is used as the substrate 110 includes a polyimide. When a polyimide is used as the substrate 110, a heat resistant polyimide that can tolerate at a high temperature may be used considering a high heat process is performed on the substrate 110.

When a plastic is used as the substrate 110, processes of deposition, etching, etc. may be performed in a state that the plastic substrate is disposed on a carrier substrate made of a high durable material such as a glass.

The light-shielding layer 180 may be made of a material that reflects or absorbs light, for example, electric conductive material such as a metal.

Figure 7B:
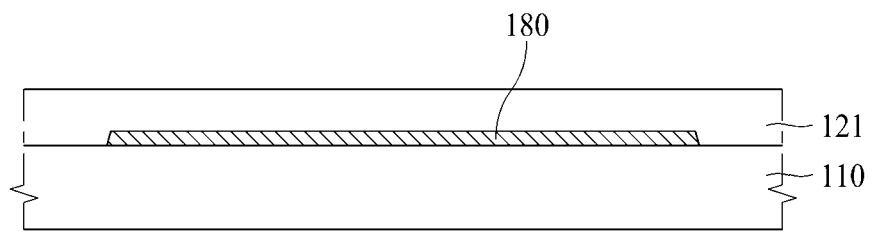

Referring to FIG. 7B, the buffer layer 121 is formed on the substrate 110 including the light-shielding layer 180. The buffer layer 121 may be formed of a silicon oxide or a silicon nitride. The buffer layer 121 may have a single layered structure or a multi-layered structure.

Figure 7C:
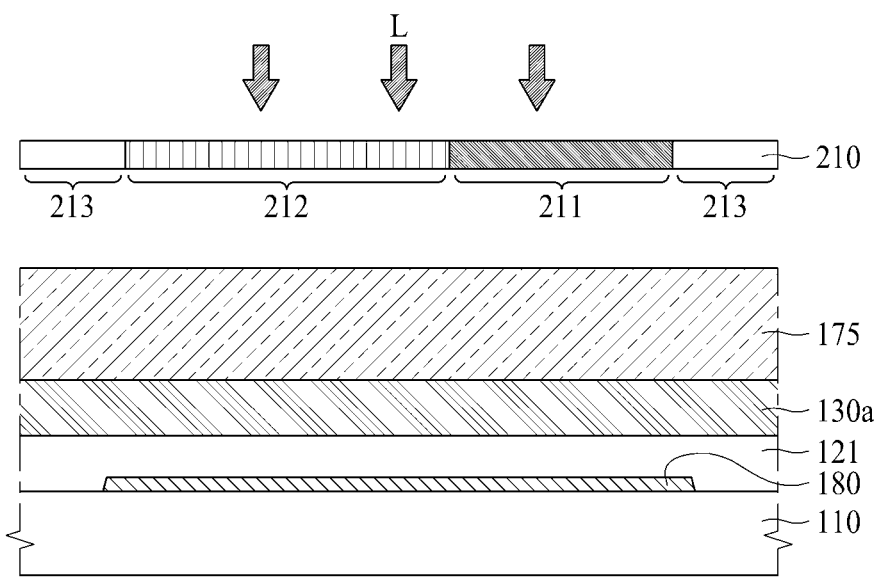

Referring to FIG. 7C, an oxide semiconductor material layer 130a is formed on the buffer layer 121. The oxide semiconductor material layer 130a is made of an oxide semiconductor material. For example, the oxide semiconductor material layer 130a may include at least one of IZO (InZnO)-, IGO(InGaO)-, ITO (InSnO)-, IGZO(InGaZnO)-, IGZTO (InGaZnSnO), GZTO (GaZnSnO)-, GZO (GaZnO)-, and ITZO (InSnZnO)-based oxide semiconductor materials. The oxide semiconductor material layer 130a may be formed by a deposition or a sputtering.

A photoresist layer 175 is formed on the oxide semiconductor material layer 130a. The photoresist layer 175 may be made of a negative photoresist, for example.

After a half tone mask 210 is disposed on the photoresist layer 175, exposure is performed. The half tone mask 210 includes a light-shielding portion 211, a semi-transmissive portion 212, and a transmissive portion 213. As light L is irradiated through the half tone mask 210, selective exposure is performed. Ultraviolet rays may be irradiated for exposure. In this way, the step of forming the oxide semiconductor layer 130 includes a selective exposure step using the half tone mask 210.

Figure 7D:
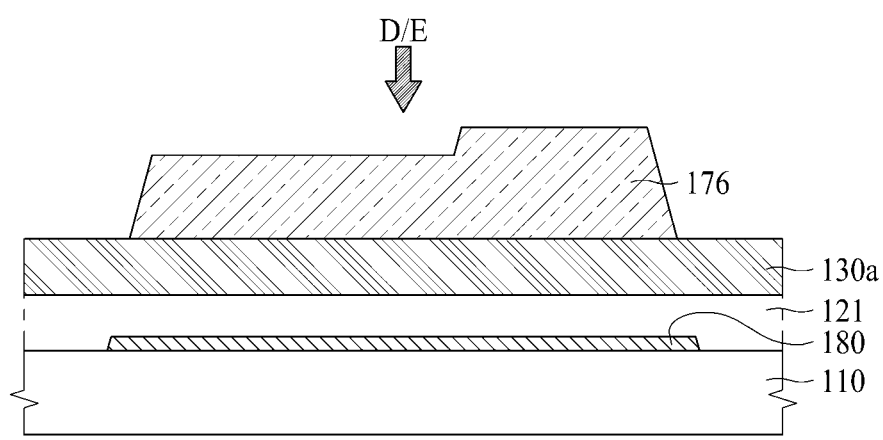

Referring to FIG. 7D, a photoresist pattern 176 is formed by selective exposure and development using the half tone mask 210. Etching is performed using the photoresist pattern 176 as a mask. Dry etching (D/E) may be used as a method of etching.

Figure 7E:
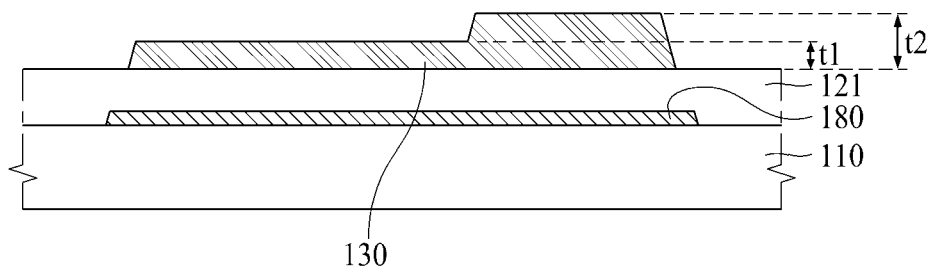

Referring to FIG. 7E, the oxide semiconductor layer 130 is formed as a result of dry etching (D/E). The oxide semiconductor layer 130 formed by selective exposure and etching may have a first thickness t1 and a second thickness t2 as shown in FIG. 7E.

Figure 7F:
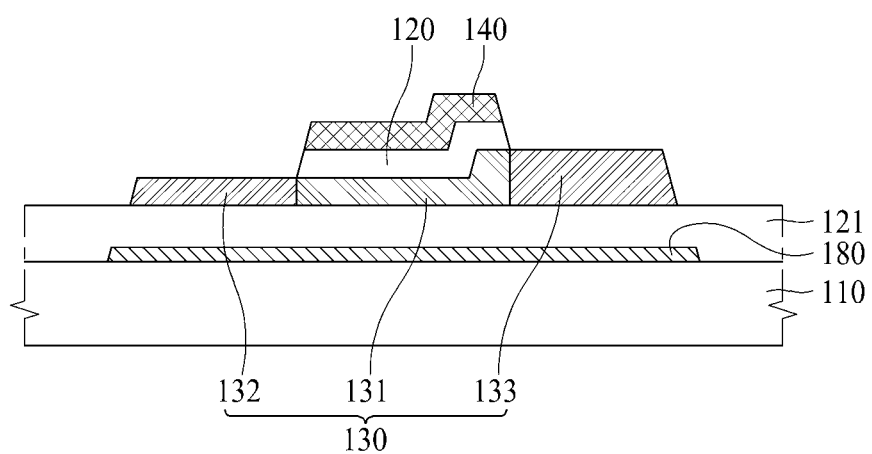

Referring to FIG. 7F, a gate insulating film 120 and a gate electrode 140 are formed on the oxide semiconductor layer 130. The gate insulating film 120 and the gate electrode 140 cover a part of the oxide semiconductor layer 130. The gate insulating film 120 and the gate electrode 140 may have a height step difference corresponding to that of the oxide semiconductor layer 130.

Also, after the gate insulating film 120 and the gate electrode 140 are formed, an exposed area of the oxide semiconductor layer 130 is conductorized. Therefore, a first channel connecting portion 132 and a second channel connecting portion 133 are formed.

Figure 7G:
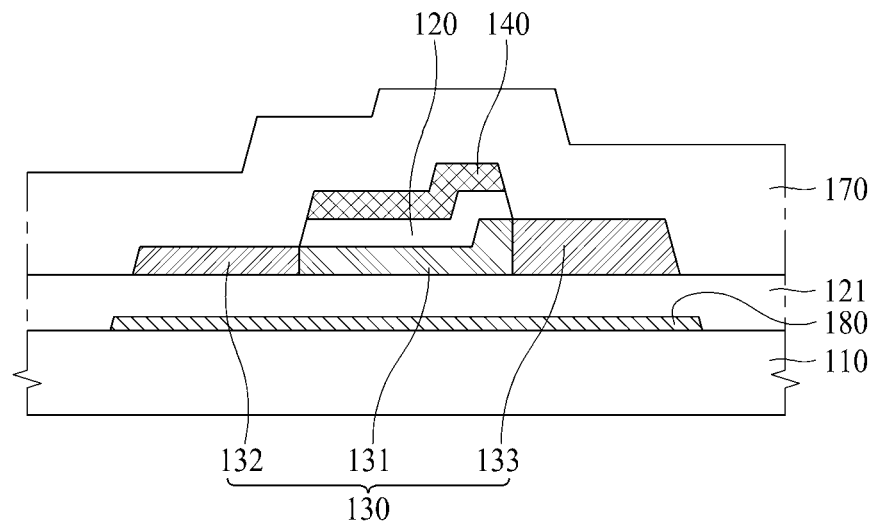

Referring to FIG. 7G, an inter-layer insulation film 170 is formed on the gate electrode 140. The inter-layer insulation film 170 may be formed of an organic material, an inorganic material, or a deposited layer of an organic layer and an inorganic layer.

Figure 7H:
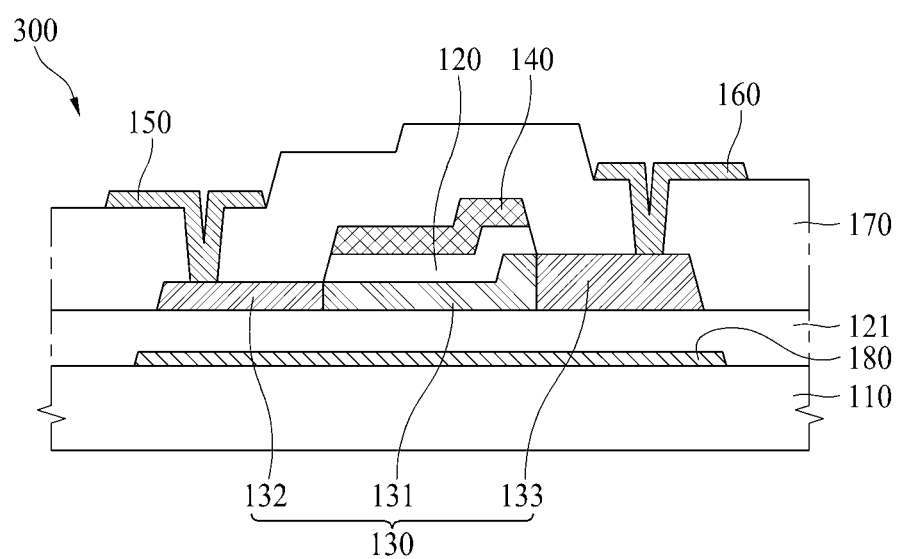

Referring to FIG. 7H, a source electrode 150 and a drain electrode 160 are formed on the inter-layer insulation film 170. Each of the source electrode 150 and the drain electrode 160 is connected with the oxide semiconductor layer 130 while they are spaced apart from each other.

In more detail, after the inter-layer insulation film 170 is partially etched to form contact holes for partially exposing the oxide semiconductor layer 130, each of the source electrode 150 and the drain electrode 160 is formed, whereby each of the source electrode 150 and the drain electrode 160 may be connected with the oxide semiconductor layer 130.

The source electrode 150 is connected with the oxide semiconductor layer 130 at the first channel connecting portion 132 and the drain electrode 160 is connected with the oxide semiconductor layer 130 at the second channel connecting portion 133. As a result, the thin film transistor 300 is made as shown in FIG. 7H.

Figure 8:
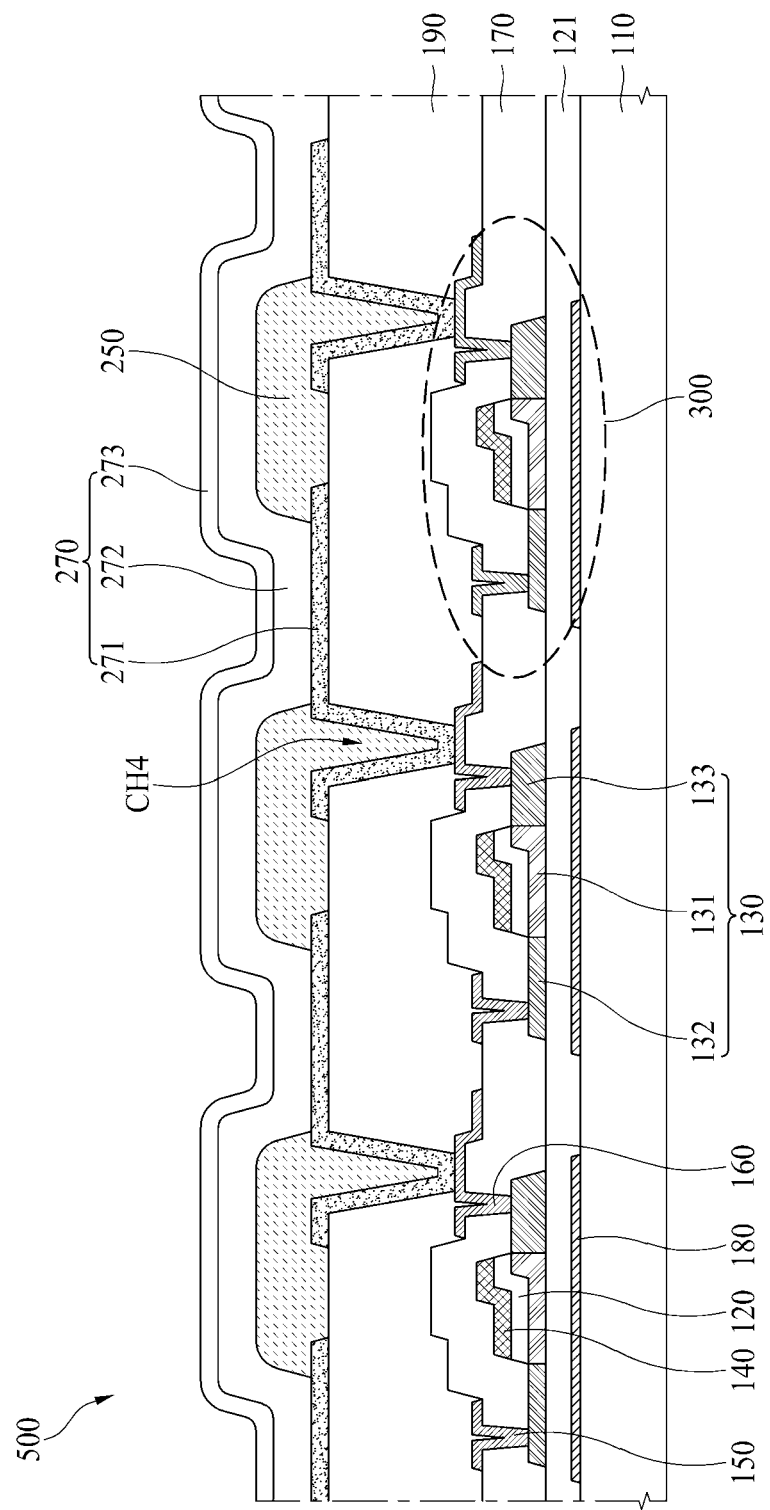
FIG. 8 is a schematic cross-sectional view illustrating a display device according to still another embodiment of the present disclosure.

FIG. 8 is a schematic cross-sectional view illustrating a display device 500 according to still another embodiment of the present disclosure.

The display device 500 according to still another embodiment of the present disclosure includes a substrate 110, a thin film transistor 300, and an organic light emitting diode 270 connected with the thin film transistor 300.

The display device 500 including the thin film transistor 300 of FIG. 5 is shown in FIG. 8. However, still another embodiment of the present disclosure is not limited to this case, and the thin film transistors 100, 200 and 400 shown in FIGS. 1, 4 and 6 may be applied to the display device 500 of FIG. 8.

Referring to FIG. 8, the display device 500 includes a substrate 110, the thin film transistor 300 disposed on the substrate 110, and a first electrode 271 connected with the thin film transistor 300. Also, the display device 500 includes an organic layer 272 disposed on the first electrode 271 and a second electrode 273 disposed on the organic layer 272.

In detail, the substrate 110 may be made of a glass or a plastic. A buffer layer 121 is disposed on the substrate 110. Also, a light-shielding layer 180 is disposed between the substrate 110 and the buffer layer 121.

The thin film transistor 300 is disposed on the buffer layer 121. Since the thin film transistor 300 has already been described, its detailed description will be omitted.

A planarization film 190 is disposed on the thin film transistor 300 to planarize an upper portion of the substrate 110. The planarization film 190 may be made of, but not limited to, an organic insulating material such as acrylic resin with photosensitivity.

The first electrode 271 is disposed on the planarization film 190. The first electrode 271 is connected with the drain electrode 160 of the thin film transistor 200 through a contact hole CH4 provided in the planarization film 190.

A bank layer 250 is disposed on the first electrode 271 and the planarization film 190 and thus defines a pixel area or a light emitting area. For example, the bank layer 250 may be disposed in a boundary area between a plurality of pixels in a matrix arrangement, whereby the pixel area may be defined.

The organic layer 272 is disposed on the first electrode 271. The organic layer 272 may be disposed even on the bank layer 250. That is, the organic layer 272 may be connected between adjacent pixels without being separated per pixel.

The organic layer 272 includes an organic light emitting layer. The organic layer 272 may include a single organic light emitting layer, or may include two organic light emitting layers deposited up and down or more than two organic light emitting layers. Light with one of red, green, or blue colors may be emitted from the organic layer 272, and white light may be emitted therefrom.

The second electrode 273 is disposed on the organic layer 272.

The organic light emitting diode 270 is made by depositing the first electrode 271, the organic layer 272, and the second electrode 273. The organic light emitting diode 270 may serve as a light-amount control layer in the display device 500.

Although not shown, if the organic layer 272 emits white light, an individual pixel may include a color filter for filtering the white light emitted from the organic layer 272 per wavelength. The color filter is disposed on a moving path of light. In case of a bottom emission method in which light emitted from the organic layer 272 moves to the substrate 110 at the lower portion, the color filer is disposed below the organic layer 272, and in case of a top emission method in which light emitted from the organic layer 272 moves to the second electrode 273 at the upper portion, the color filer is disposed above the organic layer 272.

Figure 9:
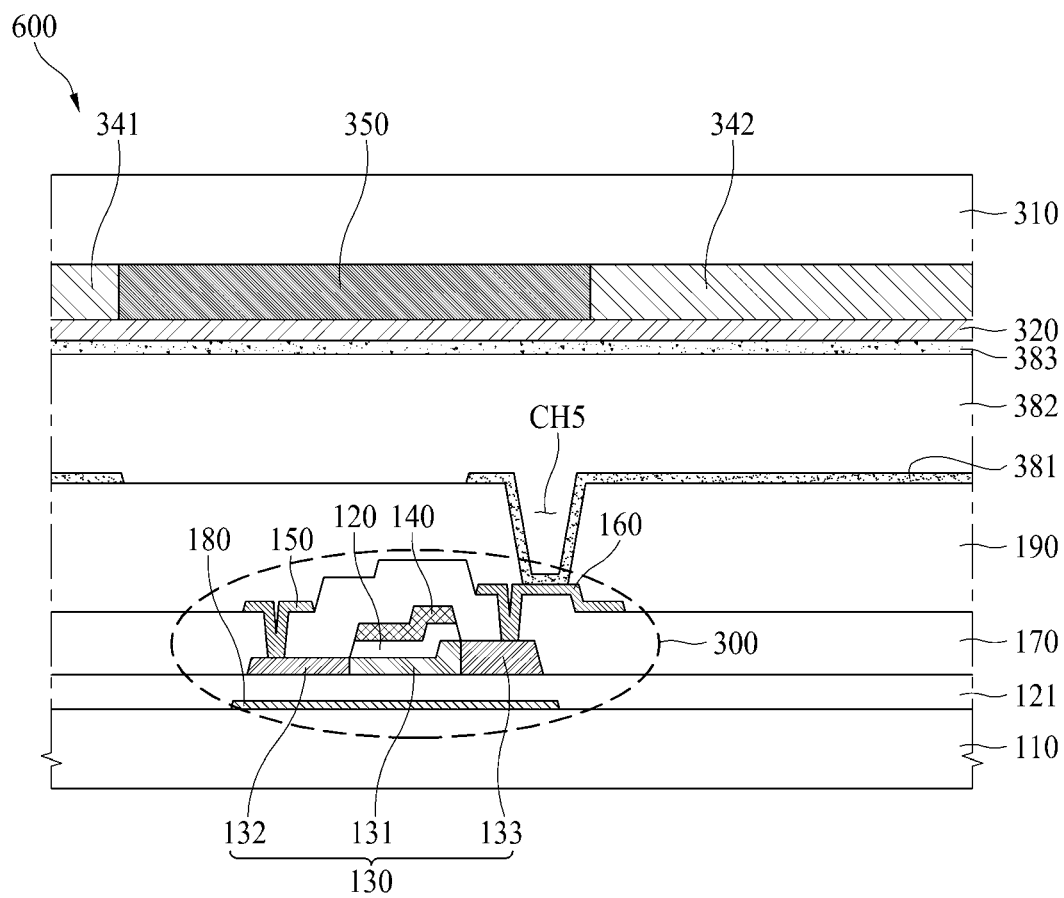
FIG. 9 is a schematic cross-sectional view illustrating a display device according to further still another embodiment of the present disclosure.

FIG. 9 is a schematic cross-sectional view illustrating a display device 600 according to further still another embodiment of the present disclosure.

Referring to FIG. 9, the display device 600 according to further still another embodiment of the present disclosure includes a substrate 110, a thin film transistor 300 disposed on the substrate 110, a first electrode 381 connected with the thin film transistor 300. Also, the display device 600 includes a liquid crystal layer 382 on the first electrode 381 and a second electrode 383 on the liquid crystal layer 382.

The liquid crystal layer 382 serves as a light-amount control layer. As such, the display device 600 shown in FIG. 9 is a liquid crystal display device including the liquid crystal layer 382.

In more detail, the display device 600 in FIG. 9 includes the substrate 110, the thin film transistor 300, a planarization film 190, the first electrode 381, the liquid crystal layer 382, the second electrode 383, a barrier layer 320, color filters 341 and 342, a light-shielding portion 350, and a facing substrate 310.

The substrate 110 may be made of a glass or a plastic. A buffer layer 121 is disposed on the substrate 110. Also, a light-shielding layer 180 is disposed between the substrate 110 and the buffer layer 121.

Referring to FIG. 9, the thin film transistor 300 is disposed on the buffer layer 121 on the substrate 110. A detailed description of the thin film transistor 300 will be omitted.

A planarization film 190 is disposed on the thin film transistor 300 to planarize an upper portion of the substrate 110.

The first electrode 381 is disposed on the planarization film 190. The first electrode 381 is connected with the drain electrode 160 of the thin film transistor 300 through a contact hole CH5 provided in the planarization film 190.

The facing substrate 310 is disposed to face the substrate 110.

The light-shielding portion 350 is disposed on the facing substrate 310. The light-shielding portion 350 has a plurality of openings. The plurality of openings are disposed to correspond to the first electrode 381 which is a pixel electrode. The light-shielding portion 350 shields light on areas except the openings. The light-shielding portion 350 is not necessarily required, and may be omitted.

The color filters 341 and 342 are disposed on the facing substrate 310 and selectively shield a wavelength of incident light from a backlight unit (not shown). In more detail, the color filters 341 and 342 may be disposed on a plurality of openings defined by the light-shielding portion 350. Each of the color filters 341 and 342 may express any one of red, green, and blue colors. Each of the color filters 341 and 342 may express a color other than red, green and blue colors.

A barrier layer 320 may be disposed on the color filters 341 and 342 and the light-shielding portion 350. The barrier layer 320 may be omitted.

The second electrode 383 is disposed on the barrier layer 320. For example, the second electrode 383 may be located on the entire surface of the facing substrate 310. The second electrode 383 may be made of a transparent conductive material such as ITO or IZO.

The first electrode 381 and the second electrode 383 are disposed to face each other, and the liquid crystal layer 382 is disposed between the first electrode 381 and the second electrode 383. The second electrode 383 applies an electric field to the liquid crystal layer 382 together with the first electrode 381.

When surfaces facing between the substrate 110 and the facing substrate 310 are defined as upper surfaces of the corresponding substrate and surfaces located to be opposite to the upper surfaces are defined as lower surfaces of the corresponding substrate, a polarizing plate may be disposed on each of the lower surface of the substrate 110 and the lower surface of the facing substrate 310.

Comparison Example 1

Figure 10:
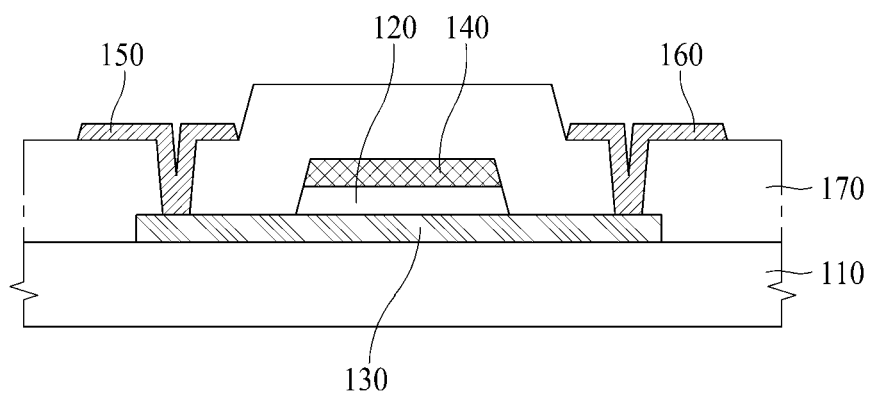
FIG. 10 is a cross-sectional view illustrating a thin film transistor according to comparison 1.

A thin film transistor of comparison example 1 was manufactured in the form shown in FIG. 10. In detail, on the substrate 110 made of a glass, an oxide semiconductor layer 130 with 15 nm in thickness and 12 μm in length was formed. The oxide semiconductor layer 130 includes In, Ga and Zn at a ratio of 1:1:1 based on the number of atoms. Then, a gate insulating film 120 made of a silicon nitride and a gate electrode 140 made of an alloy of Mo/Ti, having 100 nm in thickness was formed on the oxide semiconductor layer 130, and inter-layer insulation film 170 made of a silicon oxide was formed on the gate insulating film 120 and the gate electrode 140. Then, a source electrode 150 and a drain electrode 160, which are made of an alloy of Mo/Ti, have 100 nm in thickness, were formed, whereby the thin film transistor of the comparison example 1 was manufactured.

In the oxide semiconductor layer 130, a length of a first channel connecting portion 132 connected with the source electrode 150, a length of a second channel connecting portion 133 connected with the drain electrode 160 and a length L1 of a channel portion 131 were set to 3 μm, 3 μm, and 6 μm, respectively.

Comparison Examples 2 and 3

The comparison examples 2 and 3 are the same as the comparison example 1 except that the oxide semiconductor layer 130 of the thin film transistor of the comparison example 2 was manufactured with a thickness of 30 nm, and the oxide semiconductor layer 130 of the thin film transistor of the comparison example 3 was manufactured with a thickness of 50 nm.

Experimental Example 1 Measurement of ΔL

A conductorization permeation length $\Delta L_S$ at the first channel connecting portion 132 and a conductorization permeation lengths $\Delta L_D$ at the second channel connecting portion 133 were measured for the thin film transistors of the comparison examples 1, 2 and 3, and their sum was expressed as "ΔL" ($\Delta L = \Delta L_S + \Delta L_D$). The conductorization permeation lengths $\Delta_S$ and $\Delta L_D$ were measured by a Transmission Line Measurement (TLM) method known in the art. The measured result is shown in FIG. 11.

FIG. 11 is a graph illustrating ΔL according to a thickness of an oxide semiconductor layer 130 according to one embodiment of the present disclosure. In FIG. 11, C1, C2 and C3 are ΔL measured for the thin film transistors of the comparison examples 1, 2 and 3. Referring to FIG. 11, if the thickness of the oxide semiconductor layer 130 is increased, it is noted that ΔL is increased. Therefore, if the thickness of the oxide semiconductor layer 130 is increased to solve electric field accumulation in the oxide semiconductor layer 130, it is noted that ΔL is increased and thus an effective channel length $L_{eff}$ is reduced. Referring to FIG. 11, there is limitation in increasing the thickness of the oxide semiconductor layer 130 to avoid electric field accumulation in the oxide semiconductor layer 130.

Embodiment 1

The thin film transistor was manufactured in the same manner as the comparison example 1, wherein a thickness step difference of the oxide semiconductor layer 130 was formed. In detail, the thin film transistor having the oxide semiconductor layer 130 of a shape disclosed in FIG. 1 was manufactured. This case is referred to as the embodiment 1. In the thin film transistor of the embodiment 1, a first thickness t1 was set to 15 nm, the second thickness t2 was set to 22 nm, a length L1 of the channel portion 131 was set to 6 μm, and L2 was set to 1 μm. Also, a length of the first channel connecting portion 132 connected with the source electrode 150 was set to 3 μm, and a length of the second channel connecting portion 133 connected with the drain electrode 160 was set to 3 μm.

Experimental Example 2 Electric Field Measurement

An electric field per area of the oxide semiconductor layer 130 was measured for a thin film transistor model having a shape of the comparison example 1 and a thin film transistor model having a shape of the embodiment 1 by a simulation method based on a Silvaco Technology Computer Aided Design (TCAD). The measured result is shown in FIG. 12.

Figure 12:
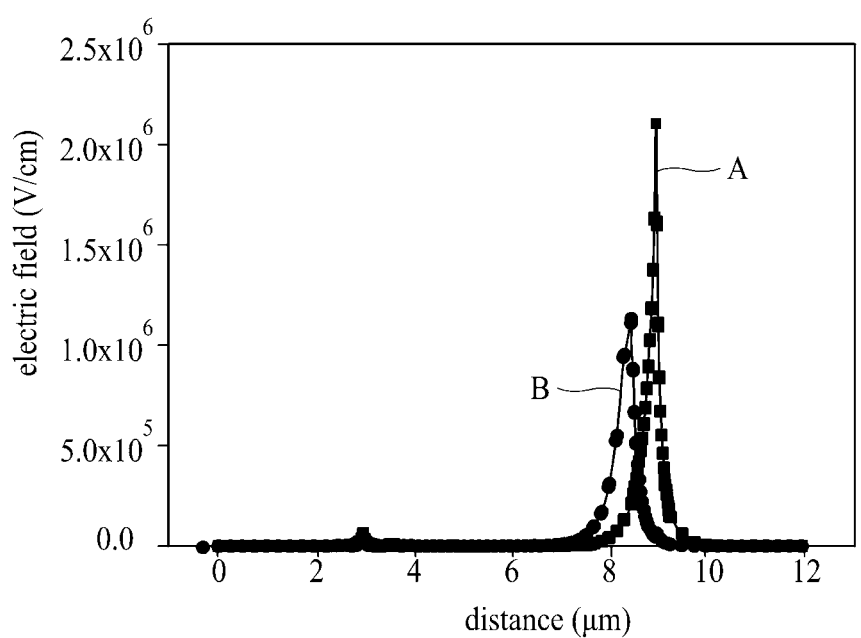
FIG. 12 is a graph illustrating electric field distribution according to a position of an oxide semiconductor layer according to one embodiment of the present disclosure.

FIG. 12 is a graph illustrating electric field distribution according to a position of an oxide semiconductor layer 130 according to one embodiment of the present disclosure. In FIG. 12, "A" represents an electric field distribution of the thin film transistor according to the comparison example 1, and "B" represents an electric field distribution of the thin film transistor according to the embodiment 1. An x-axis of FIG. 12 represents a distance according to a direction from one end (corresponding to a left end of the oxide semiconductor layer 130 shown in FIG. 1, distance of 0 μm) of the first channel connecting portion 132 to one end (corresponding to a right end of the oxide semiconductor layer 130 shown in FIG. 1, distance of 12 μm).

Referring to FIG. 12, in case of the thin film transistor ("A" of graph) according to the comparison example 1, it is noted that an electric field is strongly concentrated on a boundary portion (near a distance of 9 μm) between the channel portion 131 and the second channel connecting portion 133. For reference, weak electric field accumulation occurs in a boundary portion (near a distance of 3 μm) between the channel portion 131 and the first channel connecting portion 132.

On the other hand, in case of the thin film transistor ("B" of graph) according to the embodiment 1, it is noted that an electric field accumulation area has been moved from a boundary portion (near a distance of 9 μm) between the channel portion 131 and the second channel connecting portion 133 to the channel portion 131 (near a distance of 8.5 μm), and that an electric field in this area has been reduced as much as 50% as compared with the comparison example 1.

As described above, in case of the thin film transistor that includes an oxide semiconductor layer 130 having a thickness step difference in accordance with one embodiment of the present disclosure, it is noted that electric field accumulation in the oxide semiconductor layer is attenuated. As a result, in the thin film transistor according to one embodiment of the present disclosure, degradation caused by electric field accumulation may be avoided or reduced.

As described above, according to the present disclosure, the following effects and advantages may be obtained.

According to one embodiment of the present disclosure, since the oxide semiconductor layer has a thickness step difference, partial electric field accumulation in the oxide semiconductor layer is attenuated or avoided when the thin film transistor is driven. As electric field accumulation is attenuated or avoided, partial damage and degradation of the oxide semiconductor layer may be avoided, whereby reliability of the thin film transistor may be improved. Also, the display device according to another embodiment of the present disclosure, which includes the thin film transistor, may have excellent reliability and display property.

In addition to the effects of the present disclosure as mentioned above, additional advantages and features of the present disclosure will be clearly understood by those skilled in the art from the above description of the present disclosure.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A thin film transistor comprising:
an oxide semiconductor layer on a substrate, the oxide semiconductor layer including a channel portion, a first channel connecting portion connected to a first end of the channel portion, and a second channel connecting portion connected to a second end of the channel portion that is opposite the first end of the channel portion;
a gate insulating film on the channel portion of the oxide semiconductor layer;
a gate electrode on the gate insulating film;
a source electrode connected with the first channel connecting portion; and
a drain electrode spaced apart from the source electrode, the drain electrode connected with the second channel connecting portion,
wherein a thickness of the second channel connecting portion is different from a thickness of the first channel connecting portion, and the second end of the channel portion has a same thickness as the thickness of the second channel connecting portion,
wherein a thickness of the channel portion is equal to or greater than the thickness of the first channel connecting portion, and
wherein a conductorization permeation length of the channel portion at a side of the second channel connecting portion is longer than a conductorization permeation length of the channel at a side of the first channel connecting portion.

2. The thin film transistor according to claim 1, wherein the thickness of the second channel connecting portion is 1.3 times to 1.7 times a thickness of the first end of the channel portion.

3. The thin film transistor according to claim 1, wherein at least a part of the second end of the channel portion has the same thickness as the thickness of the second channel connecting portion.

4. The thin film transistor according to claim 3, wherein a length of the portion of the second end of the channel portion having the same thickness as the thickness of the second channel connecting portion is 5% to 20% of an entire length of the channel portion.

5. The thin film transistor according to claim 3, wherein the first end of the channel portion has a same thickness as the thickness of the first channel connecting portion.

6. The thin film transistor according to claim 5, wherein the thickness of the first channel connecting portion is smaller than the thickness of the second channel connecting portion.

7. The thin film transistor according to claim 1, wherein a part of the channel portion between the first end of the channel portion and the second end of the channel portion has a thickness that is larger than the thickness of the first channel connecting portion and smaller than the thickness of the second channel connecting portion.

8. The thin film transistor according to claim 7, wherein the thickness of the first channel connecting portion is 0.3 times to 0.9 times the thickness of the part of the channel portion between the first end of the channel portion and the second end of the channel portion.

9. The thin film transistor according to claim 8, wherein the first end of the channel portion has a same thickness as the thickness of the first channel connecting portion.

10. The thin film transistor according to claim 9, wherein a length of the first end of the channel portion having the same thickness as the first channel connecting portion is 5% to 15% of an entire length of the channel portion.

11. A method for manufacturing a thin film transistor, the method comprising:
forming an oxide semiconductor layer on a substrate, the oxide semiconductor layer formed to include a channel portion, a first channel connecting portion connected to a first end of the channel portion, and a second channel connecting portion connected to a second end of the channel portion that is opposite the first end of the channel portion;
forming a gate insulating film on the channel portion of the oxide semiconductor layer;
forming a gate electrode on the gate insulating film;
forming a source electrode, the source electrode connected with the first channel connecting portion; and
forming a drain electrode spaced apart from the source electrode, the drain electrode connected with the second channel connecting portion,
wherein a thickness of the second channel connecting portion is formed to be different from a thickness of the first channel connecting portion, and the second end of the channel portion is formed to have a same thickness as the thickness of the second channel connecting portion,
wherein a thickness of the channel portion is equal to or greater than the thickness of the first channel connecting portion, and
wherein a conductorization permeation length of the channel portion at a side of the second channel connecting portion is longer than a conductorization permeation length of the channel portion at a side of the first channel connecting portion.

12. A display device comprising:
a substrate;
a display panel including a plurality of pixels, each pixel including a thin film transistor disposed on the substrate, at least one thin film transistor comprising:
an oxide semiconductor layer on the substrate, the oxide semiconductor layer including a channel portion, a first channel connecting portion connected to a first end of the channel portion, and a second channel connecting portion connected to a second end of the channel portion that is opposite the first end of the channel portion;
a gate insulating film on the channel portion of the oxide semiconductor layer;
a gate electrode on the gate insulating film;
a source electrode connected with the first channel connecting portion; and
a drain electrode spaced apart from the source electrode, the drain electrode connected with the second channel connecting portion,
wherein a thickness of the second channel connecting portion is different from a thickness of the first channel connecting portion, and the second end of the channel portion has a same thickness as the thickness of the second channel connecting portion,
wherein a thickness of the channel portion is equal to or greater than the thickness of the first channel connecting portion, and
wherein a conductorization permeation length of the channel portion at a side of the second channel connecting portion is longer than a conductorization permeation length of the channel at a side of the first channel connecting portion.

13. The display device of claim 12, wherein the display panel includes an organic light emitting diode (LED) display or a liquid crystal display (LCD).

14. The display device of claim 12, wherein the thickness of the second channel connecting portion is 1.3 times to 1.7 times a thickness of the first end of the channel portion.

15. The display device of claim 12, wherein at least a portion of the second end of the channel portion has the same thickness as the thickness of the second channel connecting portion.

16. The display device of claim 15, wherein a length of the portion of the second end of the channel portion having the same thickness as the thickness of the second channel connecting portion is 5% to 20% of an entire length of the channel portion.

17. The display device of claim 15, wherein the first end of the channel portion has a same thickness as the thickness of the first channel connecting portion.

18. The display device of claim 17, wherein the thickness of the first channel connecting portion is smaller than the thickness of the second channel connecting portion.

19. The display device of claim 12, wherein a part of the channel portion between the first end of the channel portion and the second end of the channel portion has a thickness that is larger than the thickness of the first channel connecting portion and smaller than the thickness of the second channel connecting portion.

20. The display device of claim 19, wherein the thickness of the first channel connecting portion is 0.3 times to 0.9 times the thickness of the part of the channel portion between the first end of the channel portion and the second end of the channel portion.

* * * * *